(12) United States Patent
Khare et al.

(10) Patent No.: US 12,294,365 B2
(45) Date of Patent: May 6, 2025

(54) INTEGRATED CIRCUIT (IC) INCLUDING A LEVEL SHIFTER HAVING FAIL-SAFE IMPLEMENTATION

(71) Applicant: TEXAS INSTRUMENTS INCORPORATED, Dallas, TX (US)

(72) Inventors: Niharika Khare, Bangalore (IN); Rajat Kulshrestha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 110 days.

(21) Appl. No.: 18/174,930

(22) Filed: Feb. 27, 2023

(65) Prior Publication Data

US 2024/0291491 A1 Aug. 29, 2024

(51) Int. Cl.
*H03K 19/0185* (2006.01)
*G11C 17/16* (2006.01)
*G11C 17/18* (2006.01)

(52) U.S. Cl.
CPC ..... *H03K 19/018521* (2013.01); *G11C 17/16* (2013.01); *G11C 17/18* (2013.01)

(58) Field of Classification Search
CPC . H03K 19/018521; G11C 17/16; G11C 17/18
See application file for complete search history.

(56) References Cited

U.S. PATENT DOCUMENTS

| 2013/0021085 A1* | 1/2013 | Kumar | H03K 3/356113 |
| | | | 327/333 |
| 2023/0397413 A1* | 12/2023 | B | H10B 20/60 |

* cited by examiner

*Primary Examiner* — Metasebia T Retebo
(74) *Attorney, Agent, or Firm* — Andrew R. Ralston; Frank D. Cimino (57) ABSTRACT

An IC including a level shifter core circuit configured to receive an input signal at an input node from a low-voltage circuit portion configured to operate with a low voltage supply level, and to translate the input signal to an output signal at an output node, the output signal having a maximum voltage greater than the low voltage supply level; and a fail-safe circuit including first and second pull-down transistors configured to respectively connect the input node and the output node to a reference voltage rail in the event that the low voltage supply level drops below a threshold level. The fail-safe circuit may also include a supply cutoff switch configured to effectuate a gated connection to the low voltage supply level in response to detecting that it is below the threshold level.

22 Claims, 8 Drawing Sheets

| | 305A | 258 | 375 | 315/317 | 306 | 311 LS_IN NODE | 313 LS_OUT NODE |
|---|---|---|---|---|---|---|---|
| | VDD_L | VDDON | FS_HV | FS_HVZ/FS_LVZ | IN | | |
| 372 | 0 | 0 | 0 | VDD_H/VDD_L | 0 | 0 | 0 |
| 374 | 0 | 0 | 0 | VDD_H/VDD_L | VDD_L | 0 | 0 |
| 376 | VDD_L | VDD_L | VDD_H | 0 | 0 | 0 | 0 |
| 378 | VDD_L | VDD_L | VDD_H | 0 | VDD_L | VDD_L | VDD_H |

422 — FORMING A FAILSAFE CIRCUIT INCLUDING FIRST AND SECOND PULL-DOWN TRANSISTORS CONFIGURED TO RESPECTIVELY CONNECT INPUT AND OUTPUT NODES OF A LEVEL SHIFTER CORE CIRCUIT TO THE REFERENCE VOLTAGE RAIL IN RESPONSE TO THE FIRST FAILSAFE SIGNAL

432 — FORMING A CUTOFF SWITCH CONFIGURED TO SELECTIVELY DECOUPLE THE INPUT BUFFER FROM THE FIRST VOLTAGE SUPPLY LEVEL RESPONSE TO A SECOND FAILSAFE SIGNAL WHEN THE FIRST VOLTAGE SUPPLY LEVEL IS BELOW THE THRESHOLD LEVEL

442 — FORMING A FAILSAFE LOGIC BLOCK CONFIGURED TO GENERATE FIRST AND SECOND FAILSAFE SIGNALS RESPONSIVE TO A LEVEL DETECTION SIGNAL FOR DETECTING WHEN THE FIRST VOLTAGE SUPPLY LEVEL IS BELOW THE THRESHOLD LEVEL

INTEGRATED CIRCUIT (IC) INCLUDING A LEVEL SHIFTER HAVING FAIL-SAFE IMPLEMENTATION

FIELD OF THE DISCLOSURE

Disclosed implementations relate generally to the field of IC design and fabrication. More particularly, but not exclusively, the disclosed implementations relate to an IC device including a level shifter with a fail-safe mechanism.

BACKGROUND

In IC design, a level shifter, also called logic-level shifter or voltage level translator, is a circuit used to translate signals from one logic level or domain to another, allowing compatibility between circuits operating with different voltage requirements. It is common to use level shifters in a variety of application environments to bridge domains between processors, logic, sensors, and other circuits such as analog frond end (AFE) circuits and input/output (I/O) drivers. Regardless of the application, it is important to ensure that false level shifting does not occur.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

In one example, an IC is disclosed, which comprises, inter alia, a level shifter core circuit configured to receive an input signal at an input node from a low-voltage circuit portion configured to operate with a low voltage supply level, and to translate the input signal to an output signal at an output node, the output signal having a maximum voltage greater than the low voltage supply level; and a fail-safe circuit including first and second pull-down transistors configured to respectively connect the input node and the output node to a reference voltage rail in the event that the low voltage supply level drops below a threshold level, thereby preventing unintentional or false level shifting of the input signal regardless of the input logic level.

In another example, an IC is disclosed, which comprises, inter alia, a first on-chip circuit portion configured to operate with a first voltage supply level; a second on-chip circuit portion configured to operate with a second voltage supply level higher than the first voltage supply level; and a level shifting block configured to translate a first signal received from the first on-chip circuit portion having a maximum voltage at the first voltage supply level to a second signal directed to the second on-chip circuit portion having a maximum voltage at the second voltage supply level. In one arrangement, the level shifting block includes an input buffer operable at the first voltage supply level, the input buffer configured to receive the first signal from the first on-chip circuit portion and to output a conditioned first signal having a maximum voltage at the first voltage supply level; and a level shifter core circuit operable at the second voltage supply level, the level shifter core circuit having an input node and an output node, the input node configured to receive the conditioned first signal and the output node configured to drive the second signal as an output signal to a node in the second on-chip circuit portion, wherein the input node and the output node are each configured to be pulled to a reference voltage rail in response to a first fail-safe signal generated on the condition that the first voltage supply level drops below a threshold level. In one arrangement, the IC may further comprise a fail-safe circuit including first and second pull-down transistors configured to respectively connect the input node and the output node to the reference voltage rail in response to the first fail-safe signal, wherein the first and second pull-down transistors each have the same gate length and width. In one arrangement, the fail-safe circuit may also include a supply cutoff switch configured to effectuate a gated connection between the input buffer and the first voltage supply level, wherein the supply cutoff switch is configured to be disabled responsive to a second fail-safe signal generated in response to detecting that the first voltage supply level is below the threshold level.

In another example, a method of fabricating an IC device is disclosed. The method may comprise, inter alia, forming a first on-chip circuit portion over a semiconductor substrate, the first on-chip circuit portion configured to operate with a first voltage supply level; forming a second on-chip circuit portion over the semiconductor substrate, the second on-chip circuit portion configured to operate with a second voltage supply level; and forming a level shifting block configured to translate a first signal received from the first on-chip circuit portion having a maximum voltage at the first voltage supply level to a second signal directed to the second on-chip circuit portion having a maximum voltage at the second voltage supply level. In one arrangement, the level shifting block may be formed to include an input buffer operable at the first voltage supply level, the input buffer configured to receive the first signal from the first on-chip circuit portion and to output a conditioned first signal having a maximum voltage at the first voltage supply level; and a level shifter core circuit operable at the second voltage supply level, the level shifter core circuit having an input node and an output node, the input node configured to receive the conditioned first signal and the output node configured to drive the second signal as an output signal to a node in the second on-chip circuit portion, wherein the input node and the output node are each configured to be pulled to a reference voltage rail in response to a first fail-safe signal generated on the condition that the first voltage supply level drops below a threshold level. In one arrangement, the method may further comprise forming a fail-safe circuit including first and second pull-down transistors configured to respectively connect the input node and the output node to the reference voltage rail in response to the first fail-safe signal, wherein the first and second pull-down transistors each have the same gate length and width. In one arrangement, the fail-safe circuit may be formed to further include a supply cutoff switch configured to effectuate a gated connection between the input buffer and the first voltage supply level, wherein the supply cutoff switch is configured to be disabled responsive to a second fail-safe signal generated in response to detecting that the first voltage supply level is below the threshold level.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Examples of the disclosure are described with reference to the attached Figures wherein like reference numerals are generally utilized to refer to like elements. The Figures are not drawn to scale and they are provided merely to illustrate examples. Numerous specific details, relationships, and/or methods are set forth below to provide an understanding of one or more examples. However, it should be understood that some examples may be practiced without such specific details. In other instances, well-known subsystems, circuits, components, structures and techniques have not been shown in detail in order not to obscure the understanding of the examples. Accordingly, it will be appreciated by one skilled in the art that the examples of the present disclosure may be practiced without such specific components, structures or subsystems, etc.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, e.g., a communicative relationship, between two or more elements that are coupled with each other. "Directly connected" may be used to convey that two or more physical features touch, or share an interface between each other. Further, in one or more examples set forth herein, generally speaking, an element, component or module may be configured to perform a function if the element may be programmed for performing or otherwise structurally arranged to perform that function.

Various examples described herein that relate generally to voltage level shifting such as may be used in certain type of memory, e.g. an EPROM. While some examples may be expected to offer certain advantages, e.g. reduced circuit size, no particular result is a requirement unless recited in a specific claim.

Figure 1A:
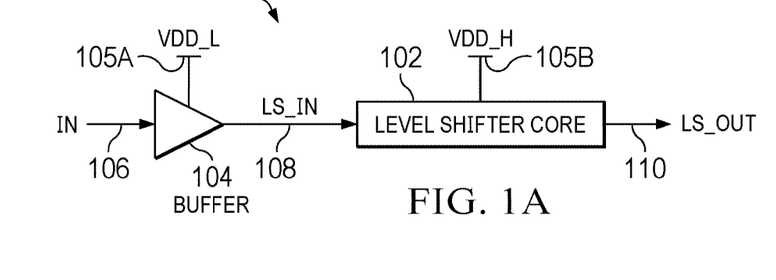
FIG. 1A depicts a representative baseline level shifting block according to an example arrangement.

Referring to the drawings, FIG. 1A depicts a representative baseline level shifting block according to an example arrangement, wherein unintentional level shifting may occur in some scenarios. Depending on implementation or application, a level shifter block 100A may be interfaced between two on-chip circuit portions (not shown in this Figure) disposed in respective voltage domains, wherein a first on-chip circuit portion may be operable with a first voltage supply level, e.g., VDD_L 105A, and a second on-chip circuit portion may be operable with a second voltage supply level, e.g., VDD_H 105B, that may be higher than the first voltage supply level. In some arrangements, the first voltage supply level may be around 1.2 V to 1.8 V whereas the second voltage supply level may be around 3.3 V to 8.0 V, depending on the semiconductor fabrication technology, application environment, and the like. In some arrangements, the first voltage supply level may range from 1.2 V to 5.5 V whereas the second voltage supply level may be greater than or equal to the first voltage supply level. Accordingly, in some examples, the first on-chip circuit portion may be referred to as a low voltage domain and the second on-chip circuit portion may be referred to as a high voltage domain. In general, level shifter block 100A may be configured to "shift up" or "translate" low voltage input signals from the low voltage domain to high voltage output signals in the high voltage domain, wherein the input/output signals may represent various types of electrical signals depending on the functionalities of the respective on-chip circuit portions interfaced by the level shifter block 100A. In an example arrangement, an input (IN) signal 106 may be presented to a buffer 104 operable at VDD_L 105A, wherein the buffer 104 may be configured to generate a level shifter input (LS_IN) 108 having the same logic as that of the input signal 106. A level shifter core 102 operable at VDD_H 105B may be configured to receive LS_IN 108 and generate an output signal (LS_OUT) 110 in the high voltage domain having the same logic as LS_IN 108.

Figure 1B:
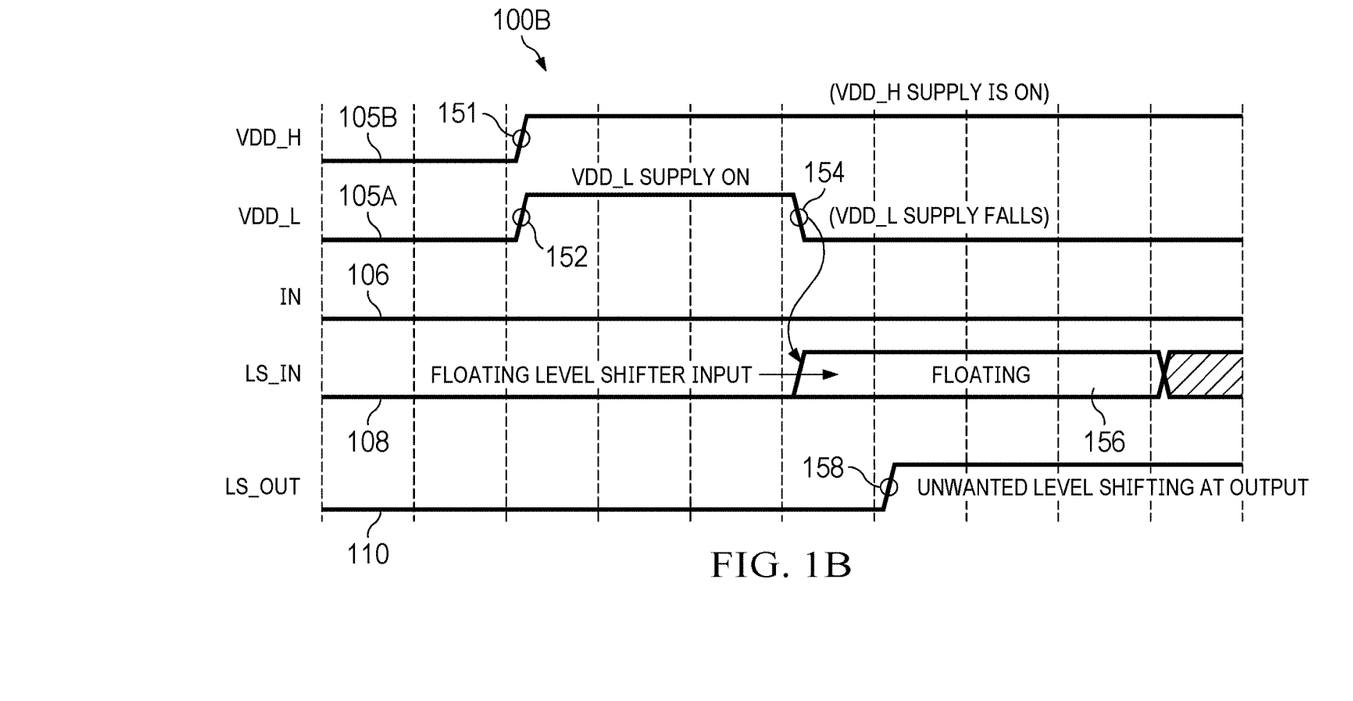
FIG. 1B depicts a timing diagram of various signals illustrating unintentional level shifting that may occur in a baseline level shifter block.

In a scenario where the high voltage supply, e.g., VDD_H 105B, is present but the low voltage supply, e.g., VDD_L 105A, falls below a threshold or is not settled properly, certain issues giving rise to false level shifting may occur. When VDD_L 105A is not present, the level shifter core input signal, e.g., LS_IN 108, is at an indeterminate level, which can unintentionally assume an incorrect logic level that may cause level shifting inadvertently. By way of example, FIG. 1B depicts a timing diagram 100B of various signals illustrating a scenario of unintentional level shifting in the level shifter block 100A. A rising edge 151 of VDD_H 105B and a rising edge 152 of VDD_L 105A are illustrative of the scenario where both voltage supplies are present at respective maximum levels. A logic low of IN signal 106 and a corresponding logic low of level shifter input LS_IN 108 exemplify the intended logic levels of the incoming signal. In similar fashion, the output signal, LS_OUT 110, is exemplified with the intended logic low level while both VDD_L 105A and VDD_H 105B are present. A falling edge 154 in VDD_L 105A causes LS_IN 108 to float, e.g., having undetermined levels over a time period, as indicated by reference number 156. An undetermined voltage level of LS_IN 108 may unintentionally assume a maximum voltage that is consistent with the low voltage domain (e.g., VDD_L), which can cause the level shifter core 102 to shift up the voltage level to a high voltage level consistent with the high voltage domain (e.g., VDD_H), thereby indicating a logic high in the output signal as exemplified by a rising edge 158 in LS_OUT 110.

Although the foregoing timing diagram 100B is particularly exemplified with respect to a scenario where the input IN signal 106 is logic low (e.g., a binary 0), unintentional level shifting can also occur where the input IN signal 106 is a logic high (e.g., a binary 1). It should be appreciated that regardless of whether IN=1 or IN=0, when the low domain voltage supply VDD_L 105A falls or is unsettled, LS_IN 108 can be floating. Given the undetermined value of LS_IN 108 in such scenario, a level shifter core may read the input value as a logic low (0) or a logic high (1), and translate accordingly. That is, IN=0 can be read as LS_OUT=1 and IN=1 can be read as LS_OUT=0. In either scenario, an incorrect logic level is unintentionally asserted at the output, which can give rise to a variety of errors in the operation of the on-chip circuitry. For example, where the level shifter block 100A is operative to output a data signal to an input/output (I/O) module, an incorrect data value may be presented to the I/O module due to false level shifting. In memory circuits or intellectual property (IP) cores where level shifters are typically employed with respect to different signals used in memory operations (e.g., program signals, address signals, read signals, data signals, etc.), false level-shifted output signals may lead to false programming of the bit cells, which can be particularly detrimental in one-time programmable (OTP) memories.

Figure 2A:
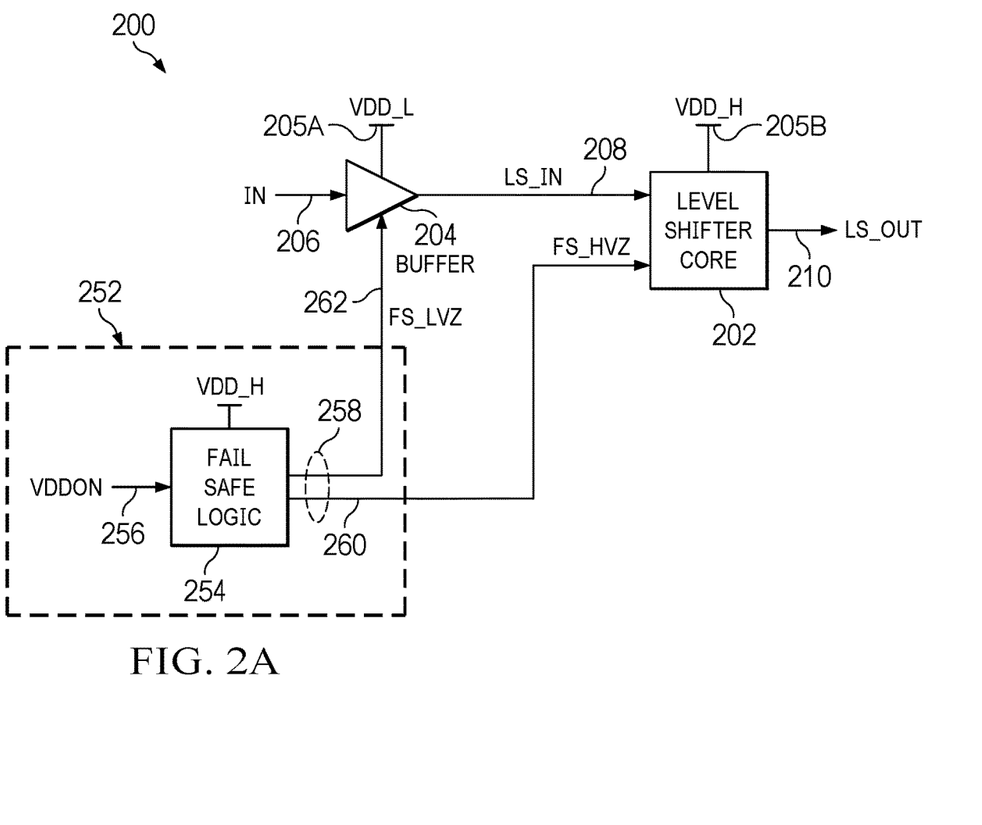
FIG. 2A depicts a representative level shifting block wherein a fail-safe mechanism may be provided for preventing unintentional level shifting according to some examples of the present disclosure.

FIG. 2A depicts a high-level block diagram of a representative level shifter block configured with a fail-safe mechanism for preventing false level shifting according to some examples of the present disclosure. In one arrangement, level shifter block 200 may include an input buffer 204 configured to receive a first signal, e.g., IN 206, from an on-chip circuit portion operable at a first voltage supply level 205A, sometimes referred to as VDD_L 205A, and generate a conditioned first signal 208 having a maximum voltage at the first voltage supply level 205A. A level shifter core 202 operable at a second voltage supply level 205B, sometimes referred to as VDD_H 205B, is configured to receive the conditioned first signal 208 at an input node (not specifically shown in this Figure) and translate (e.g., level shift) the conditioned first signal 208 to a second signal 210 directed to another on-chip circuit portion having a maximum voltage at the second voltage supply level 205B that is greater than VDD_L 205A. Consistent with the description set forth above with respect to FIG. 1A, the conditioned first signal 208 and the second signal 210 may also be referred to as LS_IN and LS_OUT signals, respectively, in this Figure.

A fail-safe block 252 comprising one or more suitable digital logic circuits 254, which may be implemented using a variety of digital logic gates in different permutations and/or combinations, may be configured to generate a plurality of fail-safe signals 258 for controlling the operation of level shifter block 200 in a fail-safe mode in order to prevent false level shifting. In one arrangement, the digital logic 254 may be configured to generate example fail-safe signals 258 on the condition that first voltage supply level 205A drops below a threshold level or is unsettled, wherein a particular one of the fail-safe signals 258, e.g., FS_HVZ 260, may be used for disabling the operation of the level shifter core 202 upon detecting the sub-threshold supply voltage level. In a further arrangement, another fail-safe signal, FS_LVZ 262, may be generated for disconnecting the input buffer 204 from the first voltage supply level 205A responsive to detecting that the fist voltage supply level 205A is below the threshold. In one arrangement, both FS_HVZ and FS_LVZ signals 260/262 may be generated responsive to a level detection signal, VDDON 256, which may be generated responsive to monitoring the first voltage supply level VDD_L 205A and detecting a sub-threshold level or unsettled condition in connection therewith. In an example implementation, VDDON 256 may be configured as an active-high signal, which may be set to low in the event that a low VDD_L is detected. In one arrangement, fail-safe logic 254 may include digital circuitry that itself may be configured as a level shifter operable to generate a level-shifted FS_HV signal (not specifically shown in this Figure) from VDDON 256 that may be provided as an input to the level shifter core 202. An inverter may be configured to invert the level-shifted FS_HV signal in order to generate FS_HVZ 260 therefrom as shown in the illustrated example. Further, another inverter may be provided for generating FS_LVZ 262 as an inverted form of the VDDON signal 256.

Figure 2B:
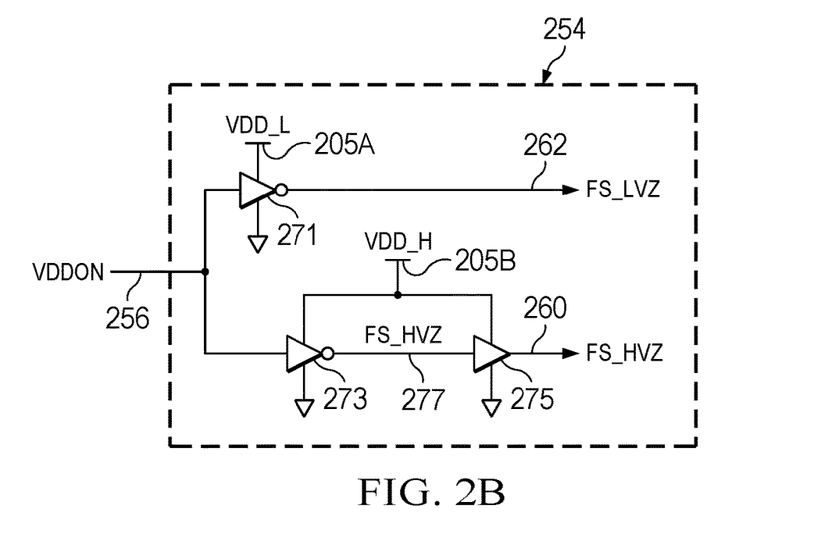
FIG. 2B depicts an example fail-safe logic implementation.

By way of illustration, an example implementation of the fail-safe logic 254 is set forth in FIG. 2B. An inverter 271 is configured to operate based on a low-voltage supply level, e.g., the first voltage supply VDD_L 205A, for generating FS_LVZ 262 by inverting the input VDDON signal 256. An inverter 273 is representative of a level-shifting inverter, e.g., a low-skewed inverter, configured to operate based on a high-voltage supply level, e.g., the second voltage supply VDD_H 205B, for generating level-shifted FS_HVZ 277 from the input VDDON signal 256. The level-shifted FS_HVZ 277 signal is in turn conditioned by a non-inverting buffer 275 also operating with the high-voltage supply level, e.g., the second voltage supply VDD_H 205B, to generate FS_HVZ 260. In some arrangements, VDD_H 205B may have the same voltage level as a programming voltage (e.g., VPP) used in a nonvolatile memory.

Figure 3A:
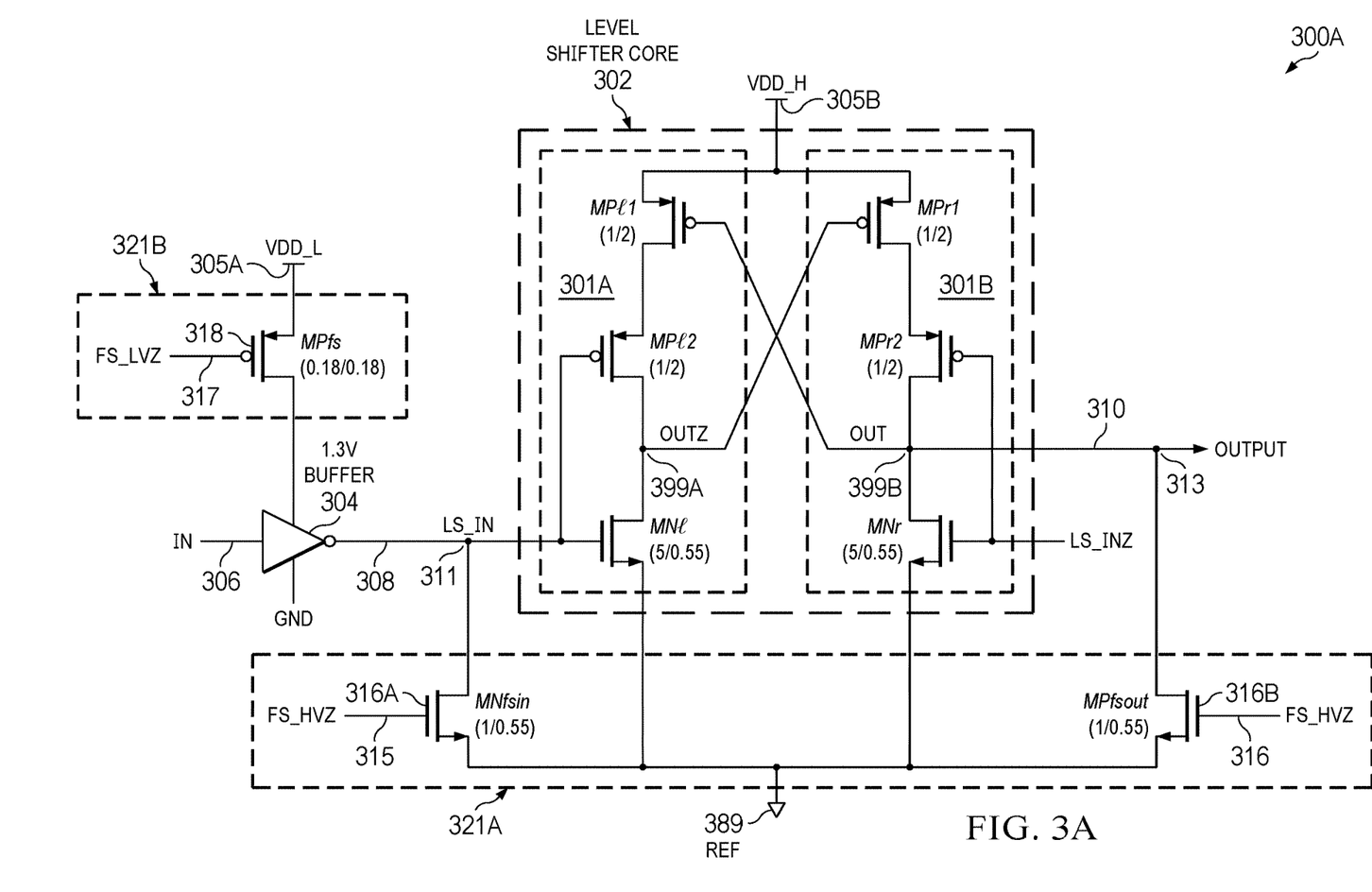
FIG. 3A depicts further details of a representative level shifting block including a plurality of fail-safe switches for preventing unintentional level shifting according to some examples of the present disclosure.

FIG. 3A depicts further details of a representative level shifter block including a plurality of fail-safe switches that may be controlled by various fail-safe signals for preventing unintentional level shifting according to some examples of the present disclosure. As illustrated, level shifter block 300A includes a level shifter core circuit 302 (operable at a VDD_H supply level 305B) that is coupled to an input buffer 304 (operable at a VDD_L supply level 305A), wherein the level shifter core circuit 302 is configured to translate a conditioned first signal 308 received as an input signal at an input node 311 from the input buffer 304 that receives a first signal 306 (IN) as an input. In one arrangement, the level shifter core circuit 302 may be formed as two symmetric lateral segments or branches, e.g., a first or left segment or branch 301A and a second or right segment or branch 301B, wherein each lateral segment may be comprised of three transistors, respectively, thereby forming three pairs of corresponding transistors. As will be set forth further below, a corresponding pair of transistors, one each from the respective segment, may comprise devices having the same device dimensions, e.g., nominally identical gate lengths and widths, thereby maintaining bilateral symmetry between the left and right branches 301A, 301B of the level shifter core circuit 302 in an example implementation. In one arrangement, the left branch 301A includes a first p-channel MOSFET (PMOS) device MPl1 coupled in series with a second PMOS device MPl2, which in turn is coupled in series with an n-channel MOSFET (NMOS) device MNl. In similar fashion, the right branch 301B includes a corresponding first PMOS device MPr1 coupled in series with a corresponding second PMOS device MPr2, which in turn is coupled in series with a corresponding NMOS device MNr. Input node 311, also referred to as LS_IN node in some examples, is configured to drive the respective gates of MPl2 and MNl devices of the left segment 301A, wherein a node 399A, referred to herein as OUTZ, that is commonly coupled to MPl2 and MNl devices is configured to drive the gate of MPr1 of the right segment 301B. A node 399B, referred to herein as OUT, that is commonly coupled to MPr2 and MNr devices of the right segment 301B is configured to drive the gate of MPl1. Additionally, node 399B is operable to drive a level shifter output (LS_OUT) node 313 that may be configured to direct a level-shifted output signal, e.g., LS_OUT signal 310, to an on-chip circuit portion as set forth previously.

In one example, level shifter block 300A includes a first fail-safe circuit portion 321A that may be configured to disable the operation of level shifter core circuit 302 in the event that the low voltage supply level, e.g., VDD_L 305A, is below a threshold. In another example, level shifter block 300A may also include a second fail-safe circuit portion 321B that may be configured to effectuate a gated connection between the input buffer 304 and VDD_L 305A, wherein the gated connection may be disabled on the condition that the VDD_L 305A is below the threshold level. In one arrangement, the first fail-safe circuit portion 321A may include a pair of NMOS transistors, e.g., first and second pull-down NMOS transistors, MNfsin 316A and MNfsout 316B, respectively, wherein a fail-safe mode of operation may involve turning on MNfsin 316A and MNfsout 316B by a first fail-safe signal, FS_HVZ 315, in order to respectively connect the input and output nodes 311, 313 to a reference voltage rail 389 (e.g., ground) in the event that VDD_L 305A is below a threshold. Further, the second fail-safe circuit portion 321B may include a PMOS transistor, MPfs 318, that is operable as a supply cutoff switch in a fail-safe mode, which may be disabled by a second fail-safe signal, FS_LVZ 317 when VDD_L 305A is below a threshold. Because unintended level shifting can occur regardless of the logic state of the input (IN) signal 306, both first and second fail-safe signals, e.g., FS_HVZ 315 and FS_LVZ 317, may be generated in an example implementation of the fail-safe logic 254 shown in FIG. 2B when IN 306 is a logic 1 or a logic 0 as long as VDD_L 305A is detected to be absent or below a threshold level. On the other hand, if the low voltage supply level VDD_L 305A is detected to be settled at a given maximum level, the fail-safe signals FS_HVZ 315 and FS_LVZ 317 may be deactivated (e.g., by assuming complementary logic levels) such that normal level shifting operations may be effectuated by the level shifter block 300A with respect to the IN signal 306, whereby output signals, e.g., LS_OUT 310 signal, having appropriate logic levels may be generated at the output node 313.

Figure 3B:
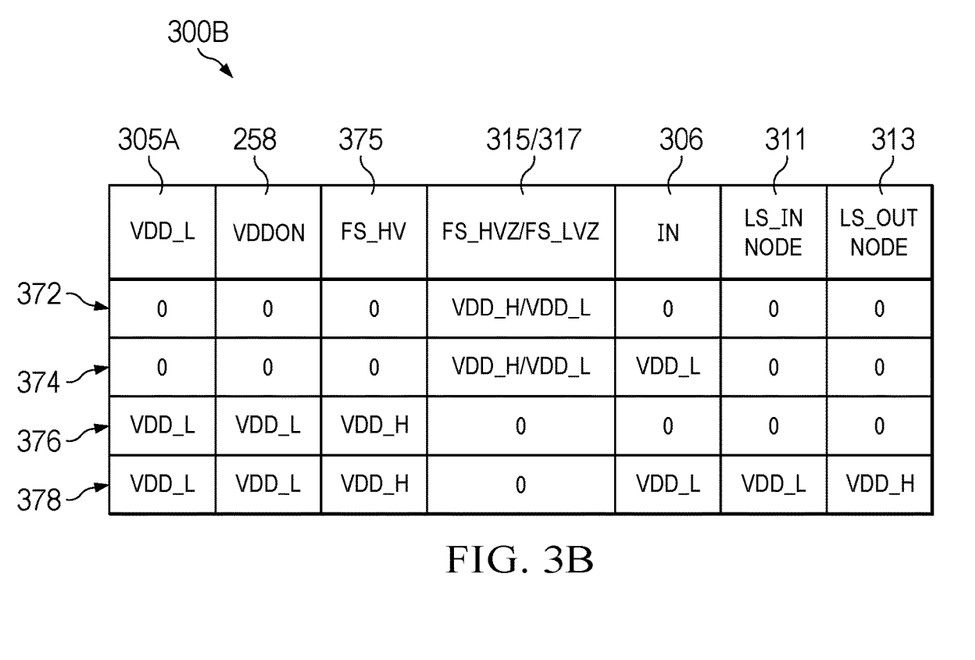
FIG. 3B is a table illustrating logic levels of various signals in operation of the level shifter block of FIG. 3A.

FIG. 3B is a table 300B illustrating logic/voltage levels of various signals in operation of the level shifter block of FIG. 3A according to an example implementation. Taking FIGS. 3A and 3B together, rows 372 and 374 represent a scenario where a first voltage supply level, e.g., VDD_L 305A, is at 0 V or below a threshold. In one arrangement, the threshold level may be configured to be implementation-specific, e.g., depending on the transistor devices used in realizing the input buffer 304. Responsive to detecting that VDD_L is at 0 V (or below the threshold), the level detection signal VDDON 256 is generated as a logic low in a fail-safe mode operation (which is normally active high having a voltage level at VDD_L in a level-shifting mode), that is used by the fail-safe logic 254 to generate an FS_HV signal 375 having a logic low. Inverting logic associated with the fail-safe logic 256 is configured to invert FS_HV signal 375, thereby generating level-shifted FS_HVZ signal 315 at a second voltage supply level, VDD_H 305B. Further, FS_LVZ signal 317 is generated as an inverted VDDON signal, thus having a voltage level at VDD_L. When FS_HVZ 315 is at a logic high, e.g., VDD_H, both MNfsin 316A and MNfsout 316B are turned on, thereby respectively connecting input node 311 and output node 313 to the reference voltage rail 389 (e.g., a grounded terminal) regardless of whether IN 306 is a logic 0 (e.g., at 0 V) or a logic 1 (e.g., at VDD_L). Further, because FS_LVZ 317 is at VDD_L, MPfs 318 is disabled, thereby electrically isolating the input buffer 304 from the supply VDD_L 305A. Because both input and output nodes 311, 313 are pulled to ground, no floating nodes are present in the level shifter core circuit 302, thereby avoiding any unintentional shifting. Moreover, by disabling MPfs 318 in a fail-safe mode of operation, the input buffer 304 is disconnected, whereby the contention between the transistors of the input buffer 304 and the pull-down device MNfsin 316A may be mitigated. Accordingly, the level shifter block 300A advantageously configured such that there is no extra load presented by the input buffer 304 at the input node 311, thereby facilitating a symmetrical operation of the pull-down devices MNfsin 316A and MNfsout 316B (e.g., the currents drawn by MNfsin 316A and MNfsout 316B in fail-safe mode are substantially identical), which can help improve the overall performance of the level shifter design in an example implementation.

Continuing to refer to FIGS. 3A and 3B, row 376 is representative of a normal mode scenario where the first voltage supply level, e.g., VDD_L 305A, is settled at the requisite maximum level (VDD_L) and IN signal 306 is a logic 0 (e.g., at 0 V). Because VDD_L 305 is at the settled level, VDDON 256 is at VDD_L level and FS_HV 375 is at level-shifted VDD_H level, thereby generating both FS_HVZ 315 and FS_LVZ 317 at respective logic 0 levels. Accordingly, the pull-down devices MNfsin 316A and MNfsout 316B are disabled, e.g., turned off, whereas the cutoff switch MPfs 318 is turned on, thereby connecting the input buffer 304 to VDD_L 305A. As IN=0, LS_IN signal 308 asserted at the input node 311 is also at logic 0. Further, the complementary LS_INZ signal 310 is at logic 1, which turns on the MNr device while tuning off the MPr2 device, thereby causing nodes 399B and 313 to be driven low. Accordingly, LS_OUT signal 310 asserted at the output node 313 is a logic low. As OUT 399B that is at logic low is coupled to the gate of MPl1 and the input node 311 that is at logic low is coupled to the gates of MPl2 and MNl devices of the left segment 301A, MPl1 and MPl2 are both turned on whereas MNl is turned off. Accordingly, OUTZ node 399A is pulled high (e.g., at VDD_H), which turns off MPr1 device of the right segment 301B.

Row 378 of table 300B is representative of a normal mode scenario where the first voltage supply level, e.g., VDD_L 305A, is at the requisite maximum level (VDD_L) and IN signal 306 is a logic 1 (e.g., at VDD_L). As before, because VDD_L 305 is at the settled level, VDDON 256 is at VDD_L level and FS_HV 375 is at level-shifted VDD_H level in this scenario also. Accordingly, both FS_HVZ 315 and FS_LVZ 317 are at respective logic 0 levels, thereby causing the pull-down devices MNfsin 316A and MNfsout 316B to be disabled and the cutoff switch MPfs 318 to be turned on. The input buffer 304 is therefore connected to VDD_L 305A. Because IN=1, LS_IN signal 308 asserted at the input node 311 is also at logic 1, whereas the complementary LS_INZ signal 308 is at logic 0, which turns off the MNr device while tuning on the MPr2 device. As LS_IN signal 308 is at logic 1, it turns on MNl device while turning off MPl2 device. Accordingly, OUTZ node 399A is driven low, which causes MPr1 to be turned on. Because both MPr1 and MPr2 devices in the right segment 301B are turned on, OUT node 399B is pulled high (e.g., at VDD_H), which causes LS_OUT signal 310 to be asserted as a level-shifted logic high at the output node 313. Further, because OUT node 399B is pulled high, MPl1 in the left segment is turned off. Accordingly, while transferring a logic high signal that is level-shifted, both MPl1 and MPl2 devices in the left segment 301A are off while MNl device is turned on to pull the OUTZ node 399A to the reference voltage rail 389.

It should be appreciated that the foregoing fail-safe implementation prevents level shifting when the low voltage supply level, e.g., VDD_L 305A, is not present or unsettled, while maintaining the symmetry of the 6-transistor (6T) arrangement of the level shifter core circuit 302. Whereas some baseline implementations may involve providing a fail-safe device in series with the MNl device in the left branch of a level shifter core, the fail-safe device in such arrangements may not only distort the symmetry of the core but also generally has a large area in order to prevent a high on-resistance ($R_{ON}$) in fail-safe mode operations. Moreover, as the symmetry of the level shifter core is maintained in an example implementation of the present disclosure (e.g., no additional transistors involved in the switching path), time delays in the path are also minimized. Consequently, the devices used in realizing the symmetric level shifter core of the present disclosure may comprise minimum-area devices having width/length (W/L) dimensions configured to meet the timing requirements of an application environment. Accordingly, area savings may also be advantageously realized in some examples of the present disclosure.

In an example implementation, level shifter core circuit 302 may be formed of four PMOS devices, MPl1, MPl2, MPr1 and MPr2, each having a gate/channel width (W) of 1.0 µm and a gate/channel length (L) of 2.0 µm, and two NMOS devices, MNl and MNr, each with a gate having W=5.0 µm and L=0.55 µm. In an example implementation, the NMOS fail-safe devices, MNfsin and MNfsout, may each have the dimensions of W=1.0 µm and L=0.55 µm, whereas the PMOS fail-safe device (MPfs) may have the dimensions of W=0.18 µm and L=0.18 µm.

Turning to FIGS. 4A-4D, depicted therein are flowcharts relating to an IC fabrication method according to some examples of the present disclosure. Example process flow 400A of FIG. 4A may commence with forming a first on-chip circuit portion in or over a semiconductor substrate, wherein the first on-chip circuit portion may be configured to operate with a first voltage supply level (block 402). A second on-chip circuit portion may be formed in or over the semiconductor substrate, wherein the second on-chip circuit portion may be configured to operate with a second voltage supply level (block 404). At block 406, a level shifting block may be formed in or over the semiconductor substrate, wherein the level shifting block may be configured to translate a first signal received from the first on-chip circuit portion having a maximum voltage at the first voltage supply level to a second signal directed to the second on-chip circuit portion having a maximum voltage at the second voltage supply level that is greater than the first voltage supply level. In one example, the level shifting block may be formed to include an input buffer operable at the first voltage supply level, wherein the input buffer may be configured to receive the first signal from the first on-chip circuit portion and to output a conditioned first signal having a maximum voltage at the first voltage supply level. In one example, the input buffer may be formed to interface with a level shifter core circuit operable at the second voltage supply level, wherein the level shifter core circuit is provided with an input node and an output node, the input node configured to receive the conditioned first signal and the output node configured to drive the second signal as an output signal to a node in the second on-chip circuit portion. In an example arrangement, the input node and the output node are each configured to be pulled to a reference voltage rail in response to a first fail-safe signal generated on the condition that the first voltage supply level drops below a threshold level.

Figure 4A:
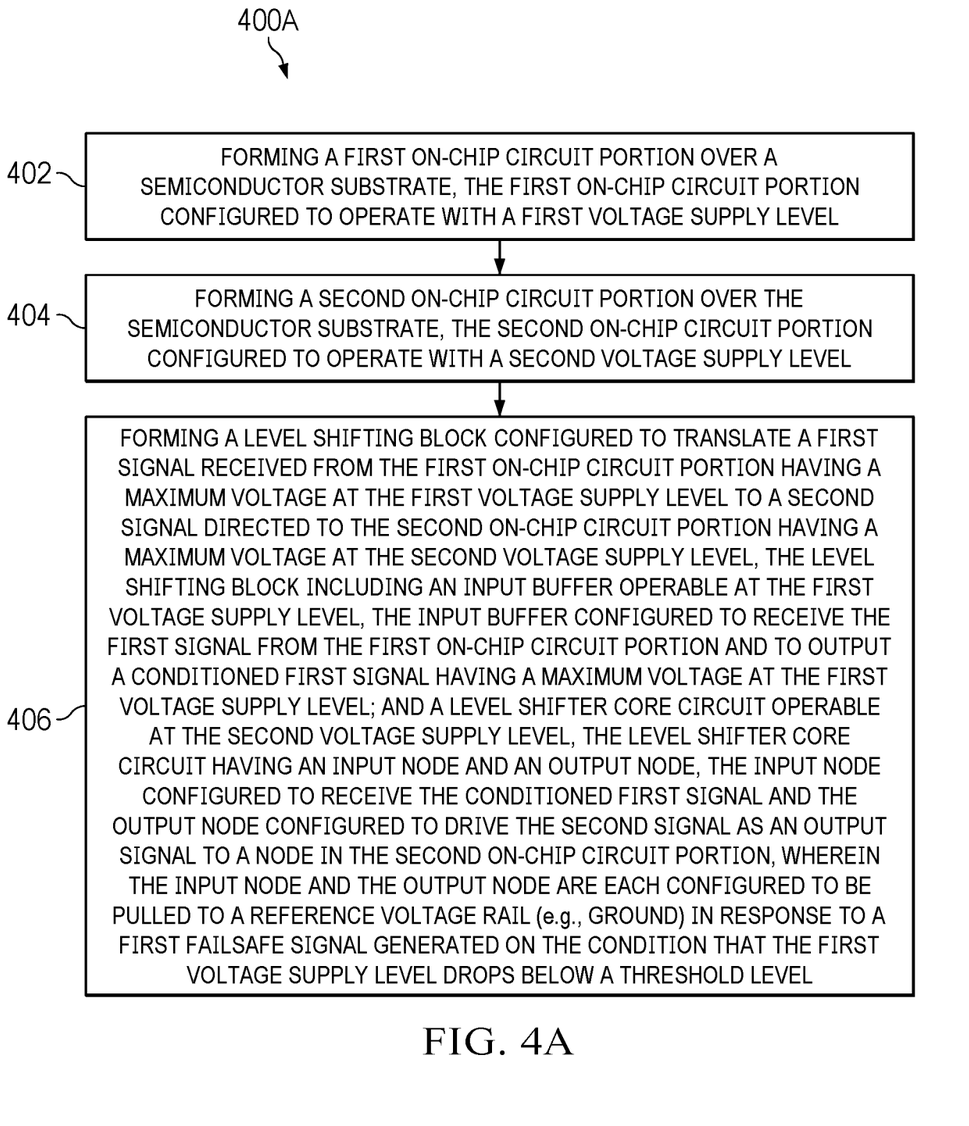
FIGS. 4A-4D are flowcharts relating to an IC fabrication method according to an example of the present disclosure.
Figure 4B:
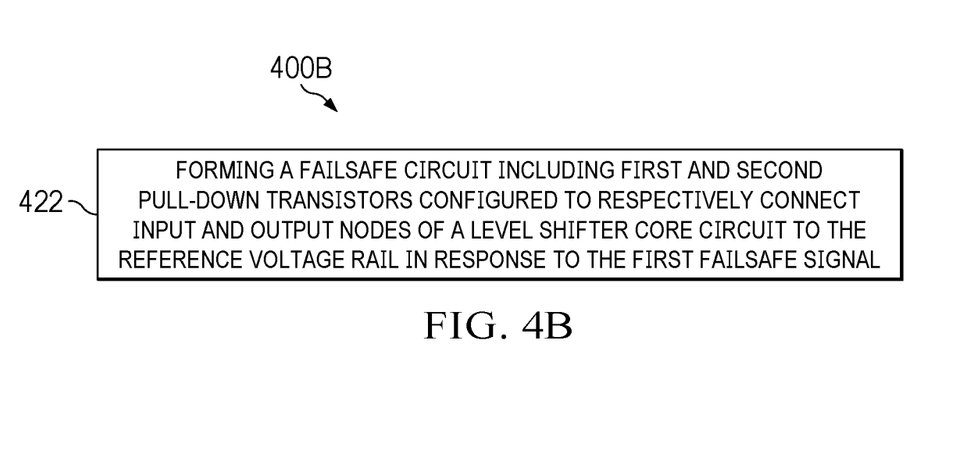
Figure 4C:
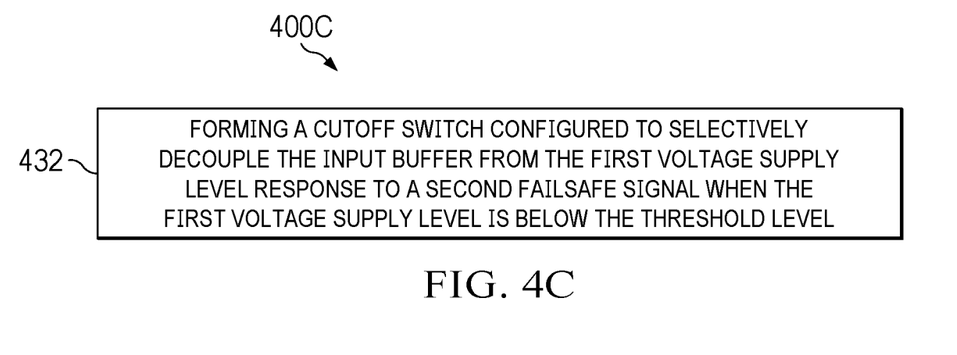
Figure 4D:
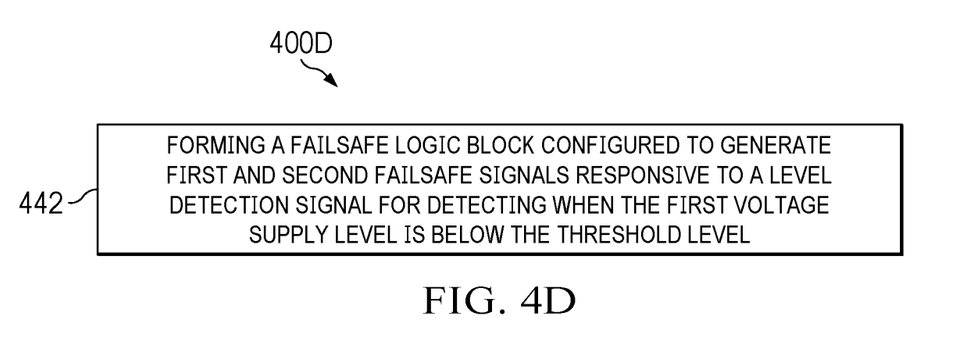

In one arrangement, an example IC fabrication method 400B shown in FIG. 4B may further comprise forming a fail-safe circuit including first and second pull-down transistors configured to respectively connect the input and output nodes of a level shifter core circuit to a reference voltage rail (e.g., a ground) in response to a first fail-safe signal generated responsive to detecting that a first voltage supply level is below a threshold level (block 422). In one arrangement, an example IC fabrication method 400C shown in FIG. 4C may further comprise forming a fail-safe cutoff switch configured to selectively disconnect an input buffer from a first voltage supply level responsive to a second fail-safe signal generated responsive to detecting that the first voltage supply level is below the threshold level (block 432). In one arrangement, an example IC fabrication method 400D shown in FIG. 4D may further comprise forming a fail-safe logic block configured to generate first and second fail-safe signals based on or otherwise responsive to a level detection signal that may be generated upon detecting that the first voltage supply level is below the threshold level (block 442).

Figure 5:
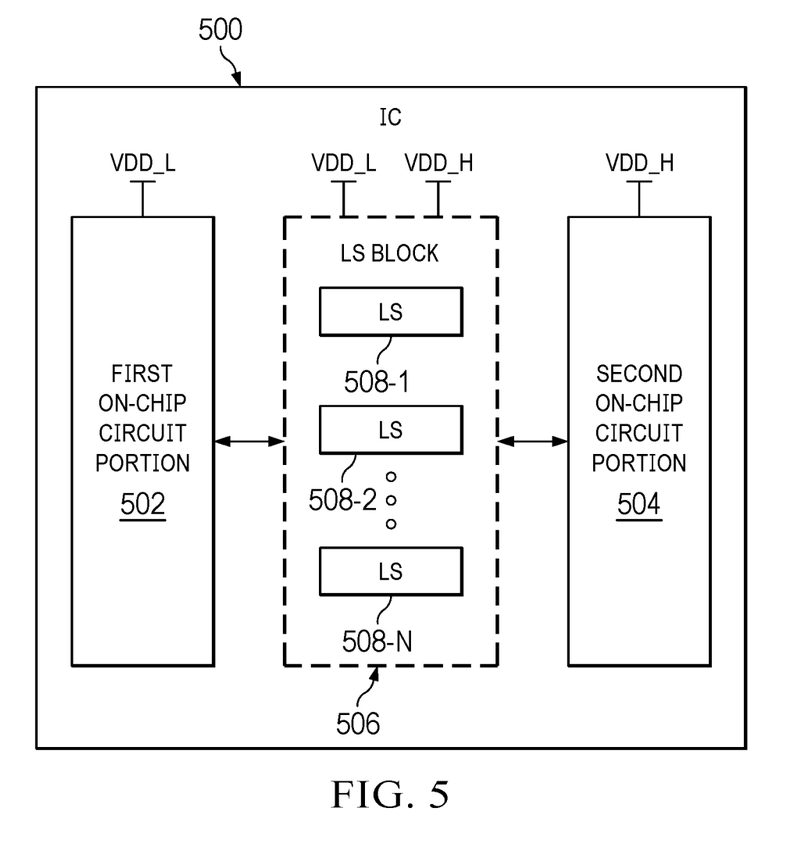
FIG. 5 is an example IC device having one or more level shifters disposed between a first on-chip circuit portion and a second on-chip circuit portion according to some examples of the present disclosure.

FIG. 5 is an example IC device 500 having one or more level shifters 5081 to 508-N interfaced between a first on-chip circuit portion 502 and a second on-chip circuit portion 504 according to some examples of the present disclosure. Depending on implementation, IC device 500 may be deployed in a variety of applications, e.g., including but not limited to audio applications, telecommunications applications, automotive applications, digital signal processing applications, optical networking applications, digital control applications, Internet-of-Things (IoT) applications, etc., wherein the IC device 500 may be disposed in a communicative relationship with one or more external circuits (not specifically shown in this Figure).

IC device 500 may be fabricated using a variety of semiconductor technologies and/or process flows, wherein on-chip circuit portions 502, 504 may comprise any combination of known or heretofore unknown electronic circuits, modules or blocks, etc., e.g., processors, microcontrollers, volatile and/or nonvolatile memory arrays, OTP arrays, logic circuits, power management circuitry, Application Specific Integrated Circuits (ASICs), Field Programmable Gate Array (FPGA) circuits, programmable system device (PSD) circuitry, System-on-Chip (SoC) circuitry, digital/analog/mixed-signal circuits, analog front end (AFE) circuits, input/output (I/O) modules, and the like. In one arrangement, the first on-chip circuit portion 502 may be configured to operate in one voltage domain, e.g., at a low voltage supply level (VDD_L), whereas the second on-chip circuit portion 504 may be configured to operate in another voltage domain, e.g., at a high voltage supply level (VDD_H). Depending on the circuit functionalities, one or more signals generated by the first on-chip circuit portion 502 at the low voltage VDD_L level may be translated into one or more signals having the high voltage VDD_H level by respective level shifters 508-1 to 508-N that may be organized into one or several groups, e.g., block 506, depending on the layout and circuit schematics of the IC device 500. In accordance with the examples herein, each level shifter may be configured with a corresponding fail-safe circuit comprising symmetric pull-down devices and a supply cutoff switch for preventing unintended or false level shifting when the VDD_L level is not present or unsettled, as set forth in detail hereinabove.

In an example implementation, the second on-chip circuit portion may comprise a memory array or IP core, wherein several level shifters may be provided depending on the size of the IP core for translating appropriate signals relating to memory bitcell operations. In general, the following signals may be provided with respect to a memory core (e.g., OTP core): PROGRAM, READ, ADDRESS[0:M−1] and DATA_IN[0:N−1], where M is the number of address bits and N is the number of data input bits, which may be generated from one or more digital circuit blocks operating at the low voltage supply level, e.g., as part of the first on-chip circuit portion 502. It should be appreciated that false level shifting in any of these signals may lead to false digital logic, resulting in incorrect programming of a memory bitcell.

For a memory core comprising an array of 64 words by 32 bits, the total number of level shifters required in an example implementation may be calculated as 6 (for the address bits) plus 32 (for the data bits) plus 1 (for PROGRAM signal) plus 1 (for READ signal), which yields a total of 40. Whereas a baseline level shifter with fail-safe implementation requires an area of about 120 $\mu m^2$, an example level shifter with fail-safe implementation of the present disclosure consumes an area of only about 95 $\mu m^2$. Accordingly, total area reduction in this example may be calculated as 40 (120−95), which yields about 20% area savings. Further, a reduction of up to 90% in switching delays (e.g., the delay between a rising edge in the incoming IN signal and a corresponding rising edge in the level-shifted LS_OUT signal) may be realized in an example implementation of the present disclosure. It should be appreciated that while the examples of the present disclosure may be expected to provide various tangible improvements over baseline implementations, no particular result is a requirement unless explicitly recited in a particular claim.

Figure 6:
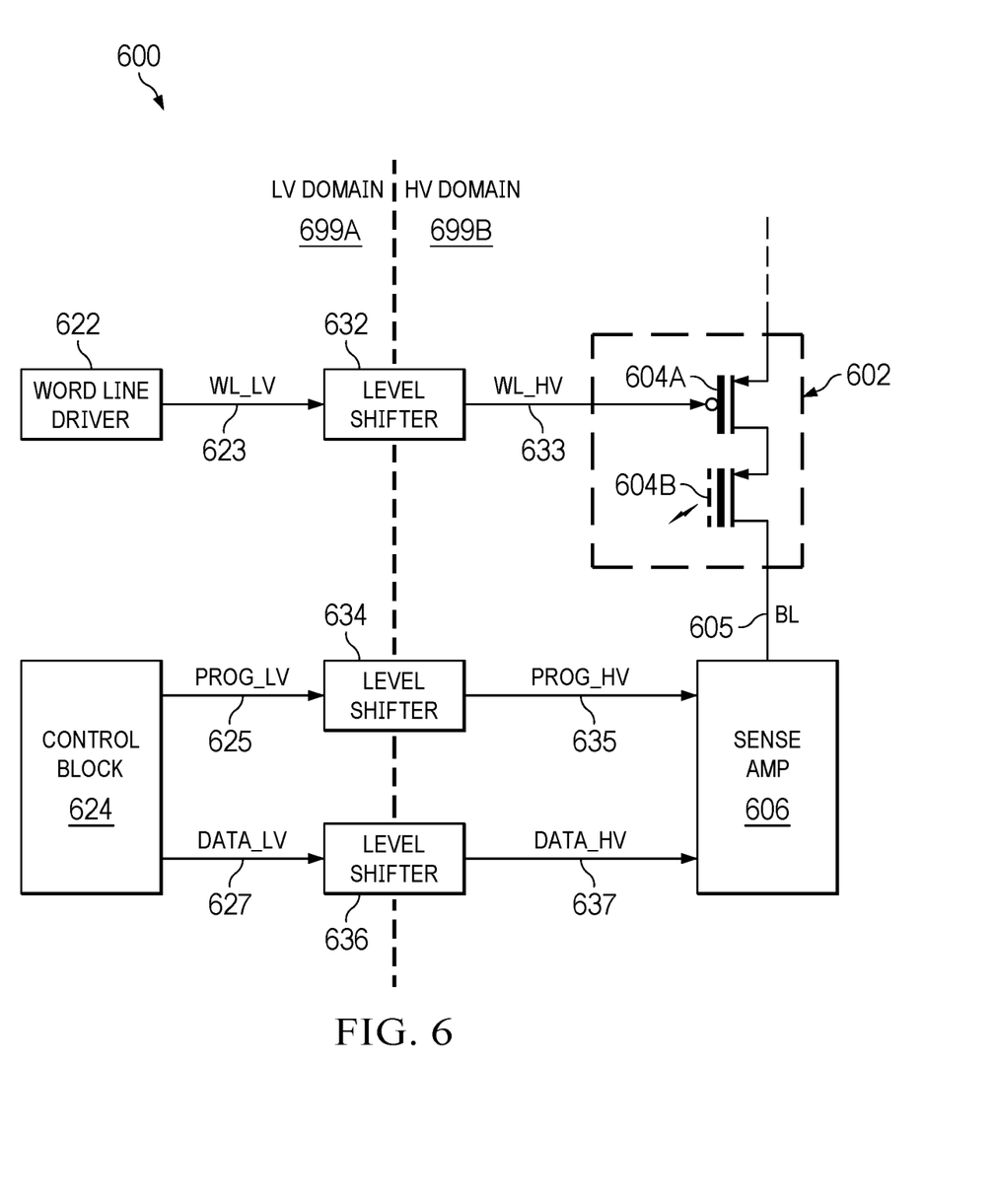
FIG. 6 depicts an OTP bitcell arrangement coupled to a plurality of level shifters in an example implementation of the present disclosure.

FIG. 6 depicts an example circuit arrangement 600 wherein an OTP bitcell 602 provided as part of an OTP array is representative of a circuit portion in a high-voltage domain 699B that may be coupled to a low voltage domain 699A for receiving level-shifted signals therefrom. Example OTP bitcell 602 comprising a select transistor 604A and an OTP storage element 604B may be part of a bit line (BL) 605 coupled to a sense amplifier (sense amp) 606 disposed in the high-voltage domain 699B. By way of example, the OTP storage element 604B may comprise an electrical fuse, anti-fuse, a floating gate cell, etc., depending on the technology and implementation. A word line driver 622 and a control block 624 are representative of circuit portions disposed in the low voltage domain 699A for providing low voltage signals associated with OTP bitcell operations. A low voltage word line select (WL_LV) signal 623 generated by the word line driver 622 is level-shifted by a level shifter 632 for generating a corresponding high voltage word line select (WL_HV) signal 633 configured to drive the gate of the select transistor 604A of the OTP bitcell 602. In similar fashion, a low voltage program (PROG_LV) signal 625 and a low voltage data (DATA_LV) signal 627 generated by the control block 624 are translated by respective level shifters 634 and 636 into corresponding high voltage prog (PROG_HV) and high voltage data (DATA_HV) signals 635, 637 for driving the data path in the sense amp 606 circuitry at applicable logic high voltages. Level shifters 632, 634, 636 may each be configured with a fail-safe mechanism according to the teaching herein, thereby avoiding various unintentional shifting scenarios with respect to the signals involved in the example OTP bitcell operations that can give rise to false programming of the OTP bitcell 602.

At least some examples are described herein with reference to one or more circuit diagrams/schematics, block diagrams and/or flowchart illustrations. It is understood that such diagrams and/or flowchart illustrations, and combinations of blocks in the block diagrams and/or flowchart illustrations, can be implemented by any appropriate circuitry configured to achieve the desired functionalities. Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An integrated circuit, comprising:
    a level shifter core circuit configured to receive an input signal at an input node from a low-voltage circuit portion configured to operate with a low voltage supply level, and to translate the input signal to an output signal at an output node, the output signal having a maximum voltage greater than the low voltage supply level; and
    a fail-safe circuit including first and second pull-down transistors configured to respectively connect the input node and the output node to a reference voltage rail in the event that the low voltage supply level drops below a threshold level.

2. The integrated circuit as recited in claim 1, wherein the reference voltage rail is grounded.

3. The integrated circuit as recited in claim 1, wherein first and second pull-down transistors have a same gate length and width.

4. The integrated circuit as recited in claim 1, wherein the first and second pull-down transistors each comprise an n-channel MOSFET (NMOS) device.

5. The integrated circuit as recited in claim 1, wherein the first and second pull-down transistors are each actuated by a first fail-safe signal generated in response to detecting that the low voltage supply level is below the threshold level.

6. The integrated circuit as recited in claim 1, further comprising an input buffer having a gated connection to the low voltage supply level.

7. The integrated circuit as recited in claim 6, wherein the gated connection is disabled by a p-channel MOSFET (PMOS) device responsive to a second fail-safe signal generated in response to detecting that the low voltage supply level is below the threshold level.

8. An integrated circuit, comprising:
    a first on-chip circuit portion configured to operate with a first voltage supply level;
    a second on-chip circuit portion configured to operate with a second voltage supply level higher than the first voltage supply level; and
    a level shifting block configured to translate a first signal received from the first on-chip circuit portion having a maximum voltage at the first voltage supply level to a second signal directed to the second on-chip circuit portion having a maximum voltage at the second voltage supply level, the level shifting block including:
        an input buffer operable at the first voltage supply level, the input buffer configured to receive the first signal from the first on-chip circuit portion and to output a conditioned first signal having a maximum voltage at the first voltage supply level; and
        a level shifter core circuit operable at the second voltage supply level, the level shifter core circuit having an input node and an output node, the input node configured to receive the conditioned first signal and the output node configured to drive the second signal as an output signal to a node in the second on-chip circuit portion, wherein the input node and the output node are each configured to be pulled to a reference voltage rail in response to a first fail-safe signal generated on the condition that the first voltage supply level drops below a threshold level.

9. The integrated circuit as recited in claim 8, wherein the reference voltage rail is grounded.

10. The integrated circuit as recited in claim 8, further comprising a fail-safe circuit including first and second pull-down transistors configured to respectively connect the input node and the output node to the reference voltage rail in response to the first fail-safe signal.

11. The integrated circuit as recited in claim 10, wherein first and second pull-down transistors have a same gate length and width.

12. The integrated circuit as recited in claim 10, wherein the first and second pull-down transistors each comprise an n-channel MOSFET (NMOS) device.

13. The integrated circuit as recited in claim 8, wherein the input buffer is configured with a gated connection to the first voltage supply level.

14. The integrated circuit as recited in claim 13, wherein the gated connection is disabled by a p-channel MOSFET (PMOS) device responsive to a second fail-safe signal generated in response to detecting that the first voltage supply level is below the threshold level.

15. The integrated circuit as recited in claim 8, wherein the first voltage supply level is around 1.2 V to 5.5 V.

16. The integrated circuit as recited in claim 15, wherein the second voltage supply level is greater than or equal to the first voltage supply level.

17. The integrated circuit as recited in claim 8, wherein the second on-chip circuit portion comprises a memory circuit portion.

18. The integrated circuit as recited in claim 8, wherein the second on-chip circuit portion comprises an analog front end (AFE) configured to drive an input/output (I/O) module.

19. A method of fabricating an integrated circuit (IC) device, the method comprising:
    forming a first on-chip circuit portion over a semiconductor substrate, the first on-chip circuit portion configured to operate with a first voltage supply level;
    forming a second on-chip circuit portion over the semiconductor substrate, the second on-chip circuit portion configured to operate with a second voltage supply level; and
    forming a level shifting block configured to translate a first signal received from the first on-chip circuit portion having a maximum voltage at the first voltage supply level to a second signal directed to the second on-chip circuit portion having a maximum voltage at the second voltage supply level, the level shifting block including:
        an input buffer operable at the first voltage supply level, the input buffer configured to receive the first signal from the first on-chip circuit portion and to output a conditioned first signal having a maximum voltage at the first voltage supply level; and a level shifter core circuit operable at the second voltage supply level, the level shifter core circuit having an input node and an output node, the input node configured to receive the conditioned first signal and the output node configured to drive the second signal as an output signal to a node in the second on-chip circuit portion, wherein the input node and the output node are each configured to be pulled to a reference voltage rail in response to a first fail-safe signal generated on the condition that the first voltage supply level drops below a threshold level.

20. The method as recited in claim 19, further comprising forming a fail-safe circuit including first and second pull-down transistors configured to respectively connect the input node and the output node to the reference voltage rail in response to the first fail-safe signal.

21. The method as recited in claim 20, wherein first and second pull-down transistors each comprise an n-channel MOSFET (NMOS) device having a same gate length and width.

22. The method as recited in claim 19, wherein the input buffer is formed to have a gated connection to the first voltage supply level, the gated connection disabled by a p-channel MOSFET (PMOS) device responsive to a second fail-safe signal generated in response to detecting that the first voltage supply level is below the threshold level.

* * * * *